(12) United States Patent
Wagner et al.

(10) Patent No.: US 7,972,473 B2
(45) Date of Patent: Jul. 5, 2011

(54) METHOD FOR RECYCLING THIN-FILM SOLAR CELL MODULES

(75) Inventors: Uwe Wagner, Weimar (DE); Frank Schmieder, Buergel (DE)

(73) Assignee: Jenoptik Automatisierungstechnik GmbH, Jena (DE)

( * ) Notice: Subject to any disclaimer, the term of this patent is extended or adjusted under 35 U.S.C. 154(b) by 32 days.

(21) Appl. No.: 12/480,482

(22) Filed: Jun. 8, 2009

(65) Prior Publication Data

US 2009/0308535 A1 Dec. 17, 2009

(30) Foreign Application Priority Data

Jun. 13, 2008 (DE) .......................... 10 2008 028 425
Sep. 15, 2008 (DE) .......................... 10 2008 047 675

(51) Int. Cl.
*B32B 38/10* (2006.01)

(52) U.S. Cl. ....... 156/712; 156/753; 156/922; 29/426.1; 29/426.4

(58) Field of Classification Search .................. 156/344, 156/584; 29/426.1, 426.4
See application file for complete search history.

(56) References Cited

U.S. PATENT DOCUMENTS

2002/0074318 A1 6/2002 Vogt et al.

FOREIGN PATENT DOCUMENTS

| DE | 197 03 104 A1 | 7/1998 |
| EP | 1 830 411 A1 | 9/2007 |

OTHER PUBLICATIONS

Shibasaki, M., et al.; "Recycling of thin-film solar modules life cycle assessment case study, In: 21st European Photovoltaic Solar Energy Conference", Sep. 2006, pp. 2014-2017.

*Primary Examiner* — Mark A Osele
*Assistant Examiner* — Nickolas Harm
(74) *Attorney, Agent, or Firm* — Duane Morris LLP

(57) ABSTRACT

A method for recycling thin-film solar cell modules which are which are composed of a substrate layer with a superimposed structure of functional layers, a plastic layer that encapsulates the functional layers, and a cover layer. The substrate layer is transparent to a working laser beam, and the first functional layer, an electrode layer, is able to absorb this working laser beam. The free surface of the substrate layer is scanned with the working laser beam so that the first electrode layer, due to having absorbed the working laser beam, is at least partially vaporized and the superimposed structure of the functional layers is thus detached from the substrate layer. The substrate layer, separately from the functional layers that are attached to the plastic layer and the cover layer, is subsequently available for separate further processing.

9 Claims, No Drawings

METHOD FOR RECYCLING THIN-FILM SOLAR CELL MODULES

FIELD OF THE INVENTION

The method of the invention is directed to recycling thin-film solar cell modules comprising a substrate layer of glass or another laser-transparent material.

BACKGROUND OF THE INVENTION

Thin-film solar cell modules are composed of a substrate layer on which, in the order listed, a first electrode layer, a semiconductor layer, a second electrode layer, a plastic layer for encapsulating the aforementioned functional layers, and a cover layer are deposited. The plastic layer is directly joined to a circumferential edge region along the substrate layer.

The method can be used, regardless of the material of the functional layers, as long as the substrate layer is transparent to a laser beam used and the first electrode layer is able to absorb the laser beam used.

It is known from the prior art that a laser beam can be used to structure individual or a plurality of functional layers and to perform complete edge deletion by guiding a laser beam, which is absorbed by the layers to be removed, relative to the free surface of the laser-transparent substrate layer and by directing this laser beam at this free surface.

In the method according to the present invention, the use of a laser beam which can be absorbed by the electrode layer is mandatory. This means that manufacturers of solar cell modules, who perform an edge deletion and/or structure at least the first electrode layer by means of a laser, are able to use this laser to carry out the recycling method. Systems in which the beam can be expanded and shaped in a manner suitable to perform edge deletion can also be used to carry out the method according to the present invention.

In contrast to structuring and edge deletion, the objective of which is the complete removal of the layers along the tracks across a width ranging from 20 µm to 90 µm and 10 mm to 60 mm, respectively, without damage to the substrate carrier, it is irrelevant to the recycling method whether or not the substrate carrier is damaged.

Also by comparison, the concern is not the complete removal of one or more layers but only the detachment of the superimposed structure of the functional layers from the substrate layer, with only the first electrode layer being at least partly evaporated and the subsequently following semiconductor layer remaining as unaffected as possible.

At the same time, the local thermal load from the energy input must be kept as low as possible so that the plastic layer does not melt, in order to ensure that the plastic layer and the remaining functional layers continue to adhere to the cover layer, if at all possible, in one piece.

DESCRIPTION OF EMBODIMENTS

The present invention will be explained in greater detail based on practical examples.

To carry out the method, the substrate layer of the thin-film solar cell module, in all of the practical examples, is scanned from its free surface with the working laser beam.

According to a first practical example, first the inner region that is enclosed by the edge region is completely scanned so that the gases that form during the vaporization of the material cannot escape. The resulting enclosed gas volume prevents, in particular, the resultant melted material of the first electrode layer from solidifying on the substrate layer, thereby ensuring that parts of the composite structure of the functional layers cannot adhere again to the substrate layer.

Scanning preferably takes place along tracks which extend in the longitudinal or transverse direction of the normally rectangular thin-layer solar cell module. By scanning the adjacent tracks one directly next to the other, a closed area is formed, across which the first electrode layer detaches itself from the substrate layer and a gas volume can develop in the resulting interspace.

This scanning regimen, however, leads to a high thermal load which is undesirable as it softens especially the plastic layer.

The thermal load can be reduced by scanning the tracks at a certain distance from one another, which distance equals the width of the tracks or a multiple of the width of the tracks.

By scanning the surface along tracks that are spaced at a distance from one another and by subsequently scanning along tracks that are offset by the same track distance in the regions of the spaces by means of the working laser beam, the energy input, both in regards to location and time, is more uniform than when immediately adjacent tracks are scanned one after the other.

Thus, the thermal load exerted on the plastic layer is reduced while the process parameters which are geared to a short processing time remain unchanged.

A track is preferably scanned by focusing the working laser beam along a line at right angles to the direction of the track and by guiding it in the direction of the track. Or a scanner is moved in the direction of the track relative to the thin-film solar cell module while the laser beam scans the track in the direction of the track width. By superimposing the two movements one upon the other, each entire surface within the track is scanned one after the other with the laser beam, with the possibility of varying the track width by specifying the scan angle.

During the scanning procedure, the plastic layer can be cooled to advantage from the direction of the cover layer, e.g., by positioning the thin-film solar cell module on a heat sink in such a manner that the cover layer is in full contact with the heat sink.

After the inner region has been completely scanned and the composite structure of the functional layers has therefore become detached from the substrate layer, only the edge region of the plastic layer continues to adhere to the substrate layer.

It would again be possible to use a laser beam to detach this attachment. Preferably, however, the plastic layer is uniformly heated along the edge region from the direction of the substrate layer, using only thermal radiation or thermal conduction until the softening temperature is reached, so as to be able to peel the plastic layer, which continues to adhere to the cover layer, along with the cover layer and the functional layers still adhering to it, off the substrate layer. Thus, the inner region of the plastic layer which was heated only along the edge region continues to be attached to the cover layer.

After this processing step, the substrate layer and the remainder of the thin-layer solar cell module are separate entities.

In the same manner in which the edge region of the plastic layer was detached from the substrate layer, the plastic layer with the remaining structure of functional layers can be separated from the cover layer.

In the end, the substrate layer and the cover layer which are frequently made of the same material, in particular glass, on the one hand, and the plastic layer attached to the second electrode layer and the semiconductor layer, on the other hand, are available for further processing.

As practical experiments have demonstrated, it is not always an advantage to keep enclosed the gas volume that forms. This means that whether it is beneficial for the process to retain the gas volume that forms between the substrate layer and the first electrode layer and to increase the gas volume by adding additional gas or to decrease it by discharging gas is determined in particular by the properties of the material of the first electrode layer.

Thus, in a second practical example, at least one opening is created in the edge region in which the plastic layer adheres directly to the substrate layer before the inner region is scanned as described in the first example. The opening can be created by locally heating an area in the edge region, e.g., by means of hot air, and can be kept open by inserting a wedge or a tubular section. Through this opening, the entire or only part of the volume of gas that forms can now escape. Similarly, it is possible to feed a foreign gas through this opening so as to generate a slight excess pressure to promote detachment.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

The invention claimed is:

1. A method for recycling thin-film solar cell modules, said thin-film solar cell modules including a substrate layer with a superimposed structure of functional layers that has a first electrode layer, a semiconductor layer, a second electrode layer, a plastic layer for encapsulating the aforementioned layers, which plastic layer along a circumferential edge region is joined directly to the substrate layer, enclosing an inner region by the circumferential edge region, and a cover layer, with the substrate layer being transparent to a working laser beam and with the first electrode being able to absorb said working laser beam, comprising scanning a free surface of said substrate layer with a working laser beam, such that said inner region is scanned, which leads to a closed area across which said first electrode layer is at least partially vaporized due to having absorbed said working laser beam, the first electrode layer detaches itself from the substrate layer, as a result of which a closed interspace is formed in which a gas volume that forms is enclosed, said superimposed structure detaching itself from said substrate layer so that said substrate layer, separately from the functional layers that are attached to the plastic layer and the cover layer, is available for separate further processing.

2. The method for recycling thin-film solar cell modules as in claim 1, wherein said plastic layer is heated from the direction of the cover layer until the softening temperature of the plastic layer is reached and that the cover layer is peeled off the plastic layer so that the cover layer, separately from the functional layers that are attached to the plastic layer, is available for separate further processing.

3. The method for recycling thin-film solar cell modules as in claim 1, wherein said edge region is subsequently heated.

4. The method for recycling thin-film solar cell modules as in claim 3, wherein said inner region is scanned along tracks that are adjacent to one another.

5. The method for recycling thin-film solar cell modules as in claim 1, wherein said inner region is scanned along tracks that are spaced at a distance from one another, with the distance equaling the width of the tracks or a multiple of the width of the tracks, which reduces the thermal load.

6. The method for recycling thin-film solar cell modules as in claim 1, wherein during the scanning procedure, the plastic layer is cooled from the direction of the cover layer.

7. The method for recycling thin-film solar cell modules as in claim 1, wherein before the inner region is scanned, at least one opening is created in the circumferential edge region.

8. The method for recycling thin-film solar cell modules as in claim 7, wherein gases that form during vaporization of material of the first electrode layer are discharged from an interspace resulting from detachment of the first electrode layer from the substrate layer through at least one opening created.

9. The method for recycling thin-film solar cell modules as in claim 7, wherein foreign gases are fed into an interspace resulting from detachment of the first electrode layer from the substrate layer through at least one opening created.

* * * * *